United States Patent [19]

Spigarelli et al.

[11] Patent Number: 4,914,513
[45] Date of Patent: Apr. 3, 1990

[54] MULTI-VISION COMPONENT ALIGNMENT SYSTEM

[75] Inventors: Donald J. Spigarelli, Carlisle; William F. Drislane, Townsend, both of Mass.

[73] Assignee: Srtechnologies, Inc., Townsend, Mass.

[21] Appl. No.: 227,380

[22] Filed: Aug. 2, 1988

[51] Int. Cl.⁴ .............................................. H04N 7/18
[52] U.S. Cl. ................................... 358/101; 358/107; 358/901
[58] Field of Search ............... 358/101, 109, 107, 901; 382/8

[56] References Cited

U.S. PATENT DOCUMENTS

| | | | |
|---|---|---|---|
| 2,803,755 | 8/1957 | Milford | 358/106 |
| 4,568,972 | 2/1986 | Arents | 358/108 |
| 4,737,845 | 4/1988 | Susuki | 358/101 |
| 4,794,647 | 12/1988 | Forgues | 382/8 |

OTHER PUBLICATIONS

Optical Inspection/Alignment of Multisided Component Connections; IBM Technical Disclosure Bulletin; Sep. 1987; vol. 30, No. 4, pp. 1506-1508.

*Primary Examiner*—Howard W. Britton
*Attorney, Agent, or Firm*—Weingarten, Schurgin, Gagnebin & Hayes

[57] ABSTRACT

A system is disclosed for viewing the aligning and soldering of an electrical component to a printed circuit board. The novel system provided the operator with a clear, close up view of the work area allowing the operator to accurately position electrical components on the work surface. Images of different sectors of the work area are received by a viewing device such as a video camera, are processed and electronically transferred to the operator's display terminal. The multiple images are displayed simultaneously on the operator's terminal. By viewing the display terminal, the operator is able to observe simultaneously the critical sectors of the work area while manipulating the electrical component with a pick-and-place head to accurately align and place the component in a pre-determined position.

6 Claims, 5 Drawing Sheets

MULTI-VISION COMPONENT ALIGNMENT SYSTEM

FIELD OF THE INVENTION

The invention relates to electrical component alignment systems and more particularly to a multi-view split-screen system for the alignment of electrical components on an electronic circuit board.

BACKGROUND OF THE INVENTION

In the electronics industry in particular, it is often necessary to align a small component in a precise predetermined position on a work surface. For example, when connecting an integrated circuit device to a printed circuit board, the I.C. contact leads or pads oppose corresponding circuit board sockets or solder pads. If precise alignment is not achieved, a necessary contact may not be effected and the I.C. must be removed from the circuit board and replaced thereon in the correct position. Prior systems designed to assure the correct positioning of a component on a work surface teach placing a reference point on the work surface adjacent the location on which the component is to be deposited. The system, either manually or automatically, moves the work surface until the reference point is aligned with a detecting means. The system then places the component on the work surface and it is presumed that the reference point is correctly aligned. Alignment is automatic rather than visual and no viewing means to verify correct alignment is provided. Consequently, if lack of alignment occurs, through mechanical error, malfunction or otherwise, an imperfect end product results.

SUMMARY OF THE INVENTION

It is the purpose of the present invention to provide a means of viewing a work area and work-pieces to permit the accurate manipulation of the work-pieces relative to the work area. The present invention provides enhanced viewing of the work area by using image detecting means to afford the operator or the machine vision system a view of as many critical sub-areas of the work area as are desired. Prior systems tracked and aligned a reference point on the work surface and deposit the work-piece thereon assuming alignment was correct without verifying placement. The present invention permits the viewer to visually align, place and confirm alignment of, the critical parts of the component and work surface.

In one embodiment, where a rectangular integrated circuit device is to be positioned upon a circuit board for soldering, four fibre optic bundles may be utilized to view the four corners of the I.C. The optical fibers are linked to a video camera which in turn is linked to a signal processor. The signal processor processes the electrical signals received from the fibre optic bundles via the camera and is connected to the operator's display terminal on which the operator observes a split screen image of the work area. The image is split into four quadrants, each quadrant affording the operator a simultaneous view of a respective corner of the component and its leads relative to the work area. The operator is thereby permitted to manipulate the work-piece, using for example a pick-and-place head, to achieve the exact alignment of the I.C. contacts and the circuit board sockets or solder pads.

It will be appreciated that the viewing devices are angularly adjustable to provide the desired angle of view.

DESCRIPTION OF THE DRAWINGS

Other object, features, and advantages of the invention will be best understood from the following detailed description, taken in conjunction with the accompanying drawings in which.

DETAILED DESCRIPTION

Figure 1:
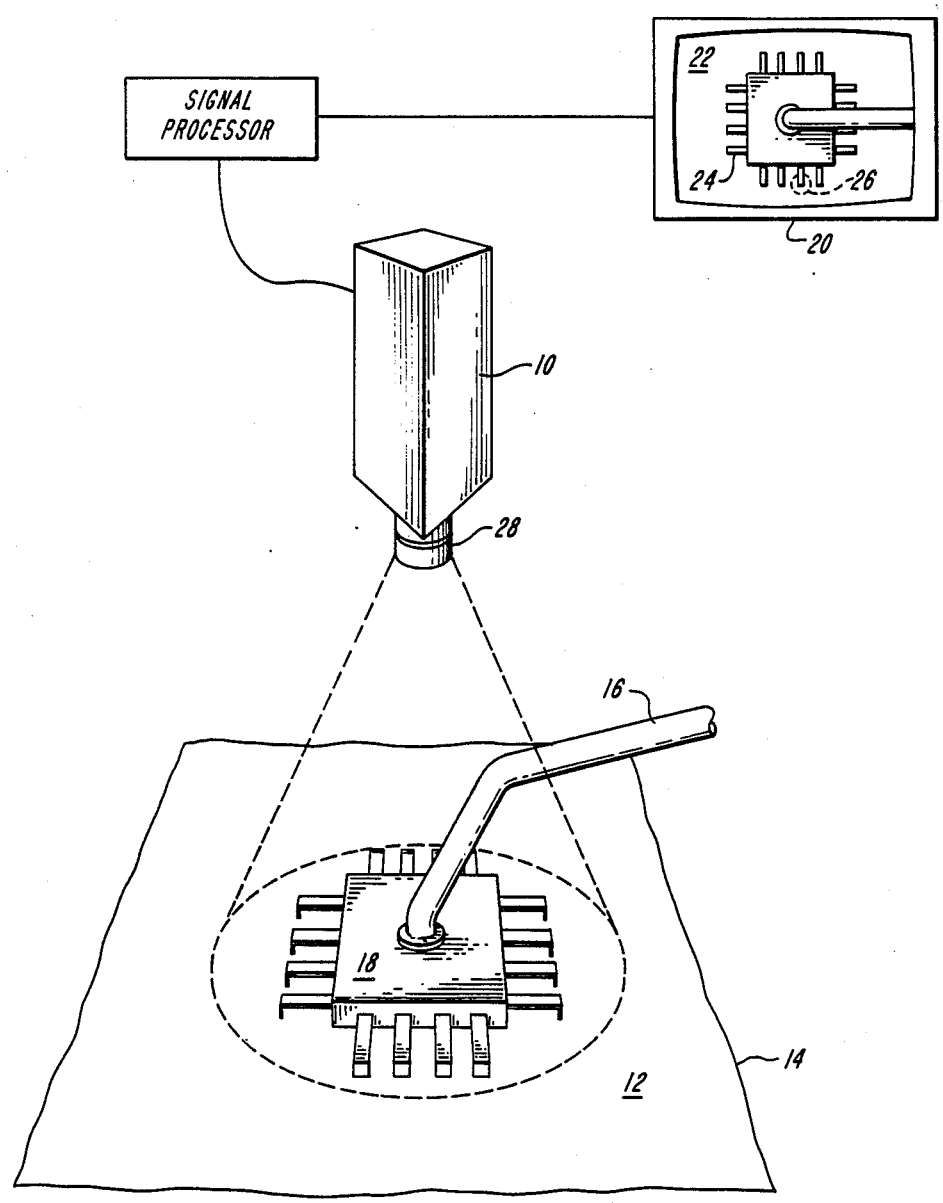
FIG. 1 illustrates a single overhead video camera providing a whole screen overhead view of the work area and work-piece.

Referring to FIG. 1 a embodiment of the present invention comprising a single video camera providing an undivided overhead view of the work area is illustrated. Camera 10 is disposed at an approximate 90° angle to the work surface 12 of circuit board 14. A pick-and-place head 16 positions an integrated circuit device 18 adjacent work surface 12. Camera 10 is electrically connected via a conventional image signal processor to display terminal 20. The undivided overhead view 22 of the work area permits the viewer to accurately align the integrated circuit contact leads 24 with the corresponding pads 26 on circuit board 14 by maneuvering pick-and-place head 16 while observing the operators display terminal 20. It will be appreciated that camera 10 may be raised and lowered, and camera lens 28 may be adjusted, to provide an enlarged or reduced view of the work area. The present invention is also used to verify the alignment of contact leads 24 and circuit board pads 26 when I.C. 18 has been placed upon and connected to cirucit board 14.

Figure 2:
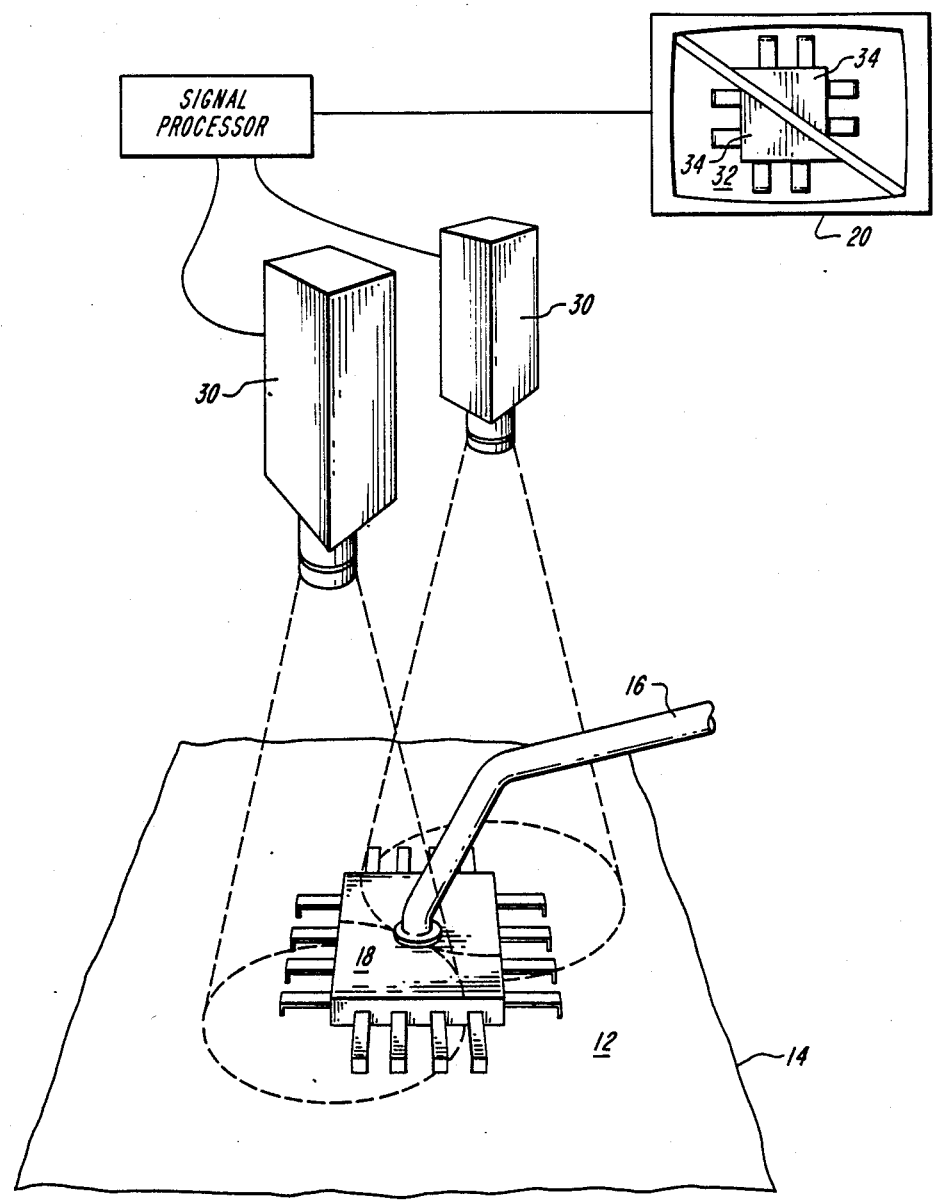
FIG. 2 illustrates two video cameras providing a split screen overhead view of the work area and work-piece.

Referring now to FIG. 2, a second embodiment of the present invention is illustrated. In this embodiment, two cameras 30 are disposed above the surface 12 of circuit board 14. I.C. 18 is held in predetermined position by pick-and-place head 16. Verification of the positioning of I.C. 18 and the soldering process is provided by cameras 30 which monitor opposing corners of I.C. 18. The electrical signals generated by the two images received by cameras 30 are processed using conventional means to provide the split screen image 32 on display monitor 20. Split screen image 32 affords the observer a simultaneous view on a single screen of two corners 34 of I.C. 18. The split screen image 32 is especially useful where the I.C. 18 or other work-piece is relatively large and a close up view of two corners of the work-piece is preferred over a lower definition image of the entire work-piece.

It will be appreciated that the split-screen image may be divided other than diagonally across video monitor 20. Moreover, the division between the split images may be other than a 50/50 configuration.

Figure 3:
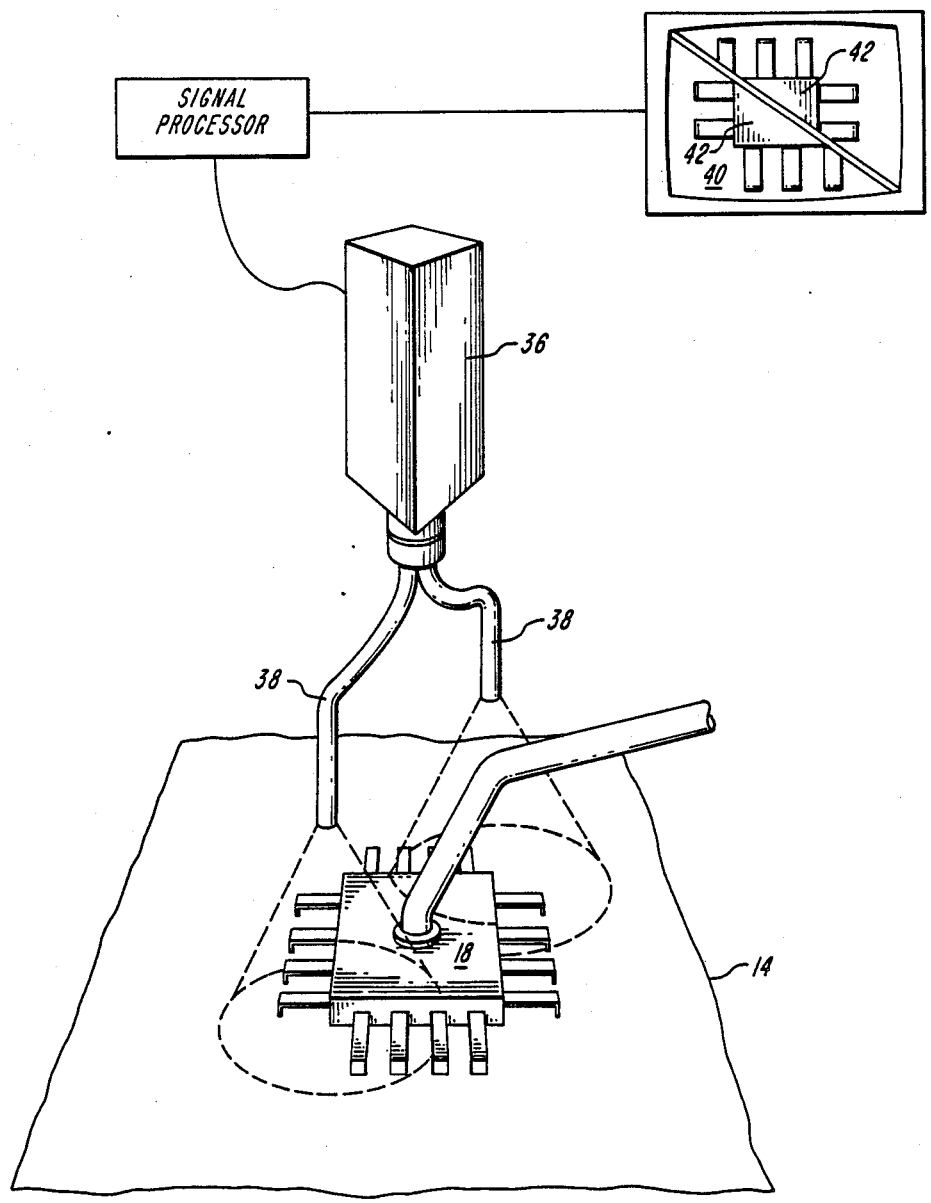
FIG. 3 illustrates a single overhead video camera with dual optical fibers providing a split-screen overhead view of the work area and work-piece.

Referring now to FIG. 3, a third embodiment of the present invention is illustrated. In this embodiment a single camera 36 is placed generally above circuit board 14 and I.C. 18. Interfacing with camera 36 are two optical fibers 38 positioned over and directed at two opposing corners of I.C. 18. Using conventional means, the electrical signals generated by the two images received by optical fibers 38 are processed by an image signal processor to provide the split-screen image 40 of opposing corners 42 of I.C. 18.

It will be appreciated that camera 36 may be remotely positioned from the work area in applications using optical fibers.

Figure 4:
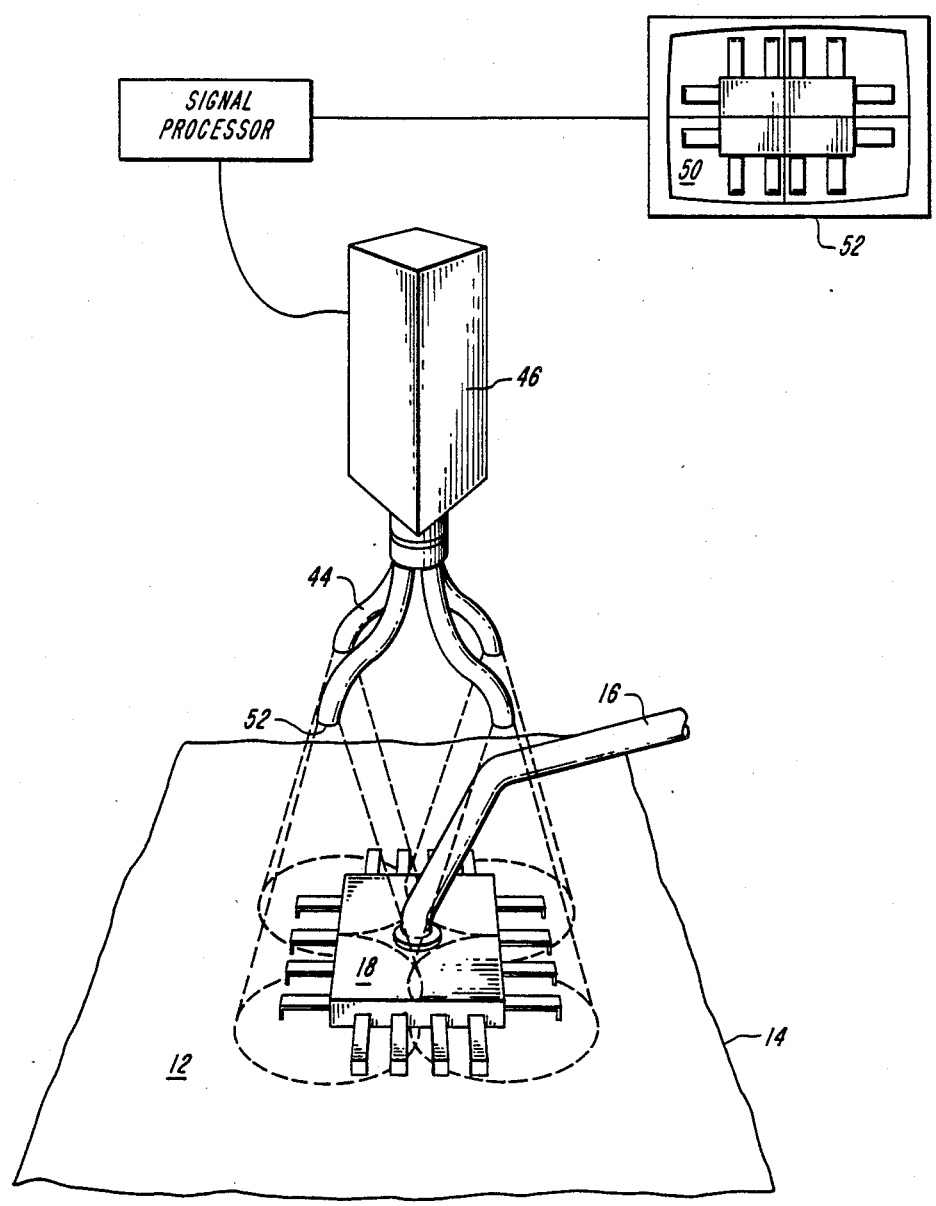
FIG. 4 illustrates a single video camera with optical fibers providing a four-way split-screen view of the work area and work-piece.

Referring now to FIG. 4, a fourth embodiment of the present invention is illustrated. In this embodiment four optical fibers 44 are connected to video camera 46. The light receiving ends 52 of optical fibers 44 are directed towards respective corners of I.C. 18 which is held proximate the surface 12 of circuit board 14 by pick-and-place head 16. Signals generated in response to the images received by optical fibers 44 pass via video camera 46 to an image signal processor to provide the split screen image 50 on display terminal 52. Split screen image 50 is divided into four quadrants providing the viewer with a clear view of the four corners of I.C. 18. The viewer is thereby afforded an opportunity to verify simultaneously that each corner of I.C. 18 is perfectly aligned in its correct position.

A greater or lesser number of optical fibers may be utilized depending on the requirements of the application. For example, where a highly irregularly shaped work-piece is to be positioned on the work surface, a greater number of optical fibers may be utilized to permit the viewer to observe the critical aligning points of the work-piece and the work area.

Figure 5:
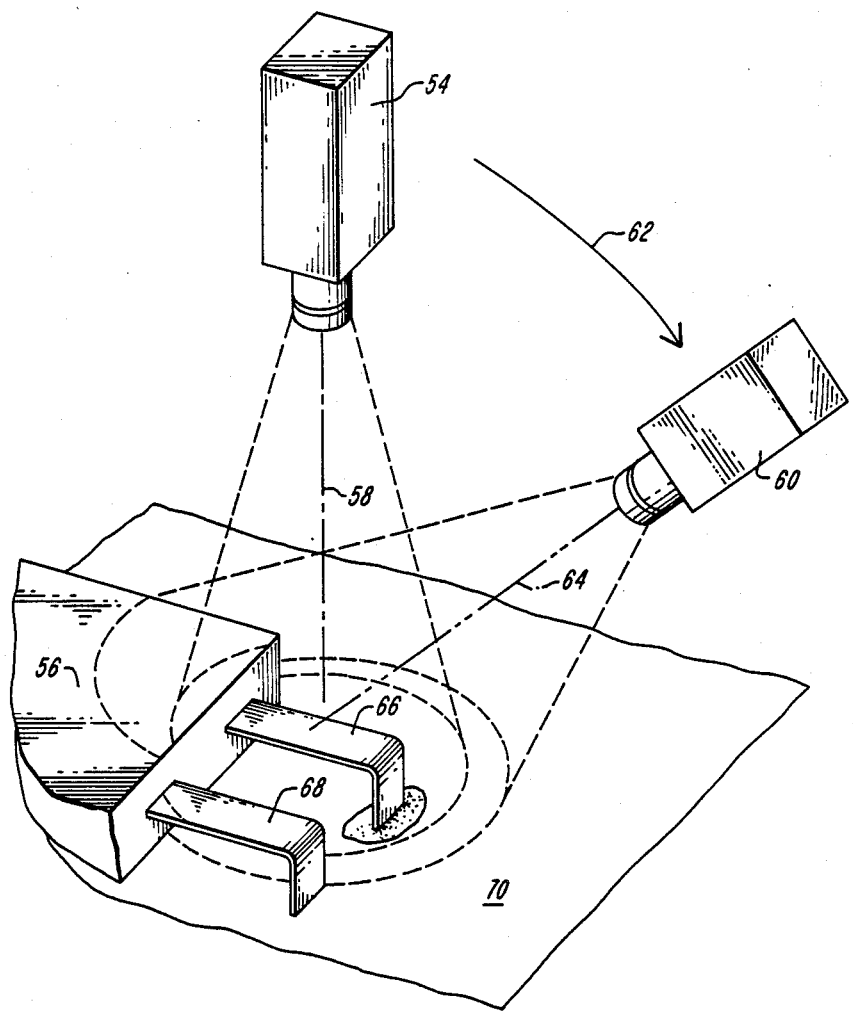
FIG. 5 illustrates an optical fiber of the present invention angularly adjusted to provide a view of the work area and work-piece in the 0-90° range.

Referring now to FIG. 5, the angular positioning of the viewing device 54 relative to work-piece 56 is illustrated. When viewing device 54 is at a 90° angle to the horizontal, the viewer has a directly overhead view of the work area as illustrated by dotted line 58. As viewing device 60 is moved to a viewing position in the direction indicated by arrow 62, the viewer receives an increasingly horizontal perspective of the work area as indicated by dotted line 64. The work area view indicated by dotted line 64 is particularly helpful to the viewer to monitor the movement of work-piece 56 when such movement is toward viewing device 60. The angular positioning of the viewing device at an angle of less than 90° to the horizontal increases the area of the view of the work surface displayed on the viewer's terminal. The increased work surface area displayed facilitates, for example, guiding contact leads 66 of I.C. 56 the onto pads 68 of circuit board 70.

The description above is intended exemplary of embodiments of the present invention which is defined according to the following claims.

What is claimed is:

1. An electrical component alignment observation system for providing a segmented view of selected portions of an electronic printed circuit board work area to the system operator, comprising:
   at least one image-receiving device adjustably positioned adjacent the work area;
   a display screen, and
   image signal processing means electrically connected to said at least one image-receiving device and said display screen for converting light received by said at least one image-receiving device into a plurality of selectively dimensioned image segments of the work area for display on said display screen.

2. The electrical component alignment observation system of claim 1 wherein said at least one image-receiving device comprises a plurality of video cameras.

3. The electrical component alignment observation system of claim 1 wherein said at least one image-receiving device comprises a plurality of optical fibers connected to a video camera.

4. The electrical component alignment observation system of claim 1 wherein said display screen comprises a cathode ray tube.

5. The electrical component alignment observation system of claim 1 further comprising means for aligning and positioning the electrical component relative to the work area.

6. The electrical component alignment observation system of claim 5 wherein said aligning and positioning means comprises vacuum pick-and-place head means.

* * * * *